US010994578B2

United States Patent
Zhou et al.

(10) Patent No.: US 10,994,578 B2
(45) Date of Patent: May 4, 2021

(54) METHOD FOR IMPROVING PRODUCTION PROCESS FOR WIDE-BASE TRUCK RADIAL TIRE

(71) Applicant: JIANGSU UNIVERSITY, Jiangsu (CN)

(72) Inventors: Haichao Zhou, Jiangsu (CN); Chen Liang, Jiangsu (CN); Jian Yang, Jiangsu (CN); Huihui Zhai, Jiangsu (CN); Guolin Wang, Jiangsu (CN); Wei Zhou, Jiangsu (CN)

(73) Assignee: JIANGSU UNIVERSITY, Jiangsu (CN)

( * ) Notice: Subject to any disclaimer, the term of this patent is extended or adjusted under 35 U.S.C. 154(b) by 466 days.

(21) Appl. No.: 15/758,171

(22) PCT Filed: Sep. 14, 2016

(86) PCT No.: PCT/CN2016/098969
§ 371 (c)(1),
(2) Date: Mar. 7, 2018

(87) PCT Pub. No.: WO2017/045600
PCT Pub. Date: Mar. 23, 2017

(65) Prior Publication Data
US 2018/0257443 A1    Sep. 13, 2018

(30) Foreign Application Priority Data

Sep. 14, 2015  (CN) .......................... 201510582746.2
Jan. 22, 2016  (CN) .......................... 201610046211.8
May 30, 2016  (CN) .......................... 201610371330.0

(51) Int. Cl.
*B60C 99/00*     (2006.01)
*B29D 30/08*     (2006.01)
(Continued)

(52) U.S. Cl.
CPC ........ *B60C 99/006* (2013.01); *B29D 30/0662* (2013.01); *B29D 30/08* (2013.01);
(Continued)

(58) Field of Classification Search
CPC .. B60C 99/006; B29D 30/0062; B29D 30/242
See application file for complete search history.

(56) References Cited

U.S. PATENT DOCUMENTS

2004/0020583 A1 *  2/2004  Zhu .................... B29D 30/0061
                                                            156/110.1
2005/0032029 A1 *  2/2005  Trunk .................... G09B 23/06
                                                            434/300
(Continued)

FOREIGN PATENT DOCUMENTS

| CN | 101923589 A | 12/2010 |
| CN | 105205243 A | 12/2015 |
| CN | 105718678 A | 6/2016  |
| JP | 2005014301 A | 1/2005 |
| JP | 2013075634 A | 4/2013 |

OTHER PUBLICATIONS

Ange Kongo-Kondé, Iulian Rosu, Frédéric Lebon, Olivier Brardo, Bernard Devésa. On the modeling of aircraft tire. Aerospace Science and Technology, Elsevier, 2013, 27 (1), pp. 67-75. ff10.1016/j.ast.2012.06.008ff. ffhal-00833556f (Year: 2013).*

*Primary Examiner* — Bijan Mapar
(74) *Attorney, Agent, or Firm* — Saliwanchik, Lloyd & Eisenschenk

(57) ABSTRACT

The present invention provides a method for improving the construction process of a wide-base radial truck tire, and the improvement of the tire construction process is realized by the design of carcass ply, the tire belt drum and the tire semi-finished components. The invention solves the problem of carcass bending, and provides theoretical guidance and technical support for improving the performance of wide-angle radial tires. The design method of the belt drum of the tire molding machine effectively controls the cords (Continued)

elongation of the belt. In addition, the problem of uneven force in the cords of the belt is eliminated, which dispels the abnormal flow of the wide-base tire shoulder rubber to the center of the crown during the shaping process, thus improving the durability and operability of the tire. The proposed semi-finished components design method in this invention can accurately design the tire semi-finished parts material distribution map, significantly improve the finished tire and the theoretical design of tire material distribution consistency, thus reducing tire development cycle and development costs.

6 Claims, 12 Drawing Sheets

(51) Int. Cl.
    *G06F 30/15*     (2020.01)
    *G06F 30/23*     (2020.01)
    *B29D 30/06*     (2006.01)
    *B29D 30/24*     (2006.01)

(52) U.S. Cl.
    CPC ............ *B29D 30/242* (2013.01); *B60C 99/00* (2013.01); *G06F 30/15* (2020.01); *G06F 30/23* (2020.01); *B29D 2030/0675* (2013.01); *B29D 2030/082* (2013.01)

(56) References Cited

U.S. PATENT DOCUMENTS

| | | | | |
|---|---|---|---|---|
| 2007/0144657 A1* | 6/2007 | Flament | ............ | B29D 30/0662 156/110.1 |
| 2009/0260743 A1* | 10/2009 | Mawby | ............ | B29D 30/0061 156/110.1 |
| 2010/0059161 A1* | 3/2010 | Asari | ............ | B60C 9/08 152/546 |
| 2011/0221086 A1* | 9/2011 | Hair | ............ | G01M 17/024 264/40.1 |
| 2012/0267031 A1* | 10/2012 | Mawby | ............ | B29D 30/0061 156/64 |
| 2013/0174956 A1* | 7/2013 | Toyoda | ............ | B60C 15/06 152/541 |

* cited by examiner (a)　　　　　　　　　(b)

(a)

(b)

(a)　　　　　　　　(b)

– – – Actual position　——— Theory position

— ·· — Green tire

METHOD FOR IMPROVING PRODUCTION PROCESS FOR WIDE-BASE TRUCK RADIAL TIRE

CROSS REFERENCE TO RELATED APPLICATIONS

This application is a National Stage Application of International Application Number PCT/CN2016/098969, filed Sep. 14, 2016; which claims priority to Chinese Application No. 201510582746.2, filed Sep. 14, 2015; Chinese Application No. 201610046211.8, filed Jan. 22, 2016; and Chinese Application No. 201610371330.0, filed May 30, 2016.

INTRODUCTION

The current invention refers to the wide-base truck radial tire production process. The invention aims to propose an improved method for wide-base radial truck tire building. By adjusting the building process of the wide-base radial truck tire, the proposed method can improve the quality of tire manufacturing as well as quality of the finished tire.

BACKGROUND OF THE INVENTION

Low-carbon economy demands in recent years continue to push tire manufactures to produce tires with fuel-savings, low emissions and improved driving safety. One of the important ways to meet this demand is tire broadening to produce a wide-base radial truck tire. Wide-base radial truck tires refer to tires with an aspect ratio of 0.65 and below. The distinguishing features of the wide-base radial truck tire are their flat nature, tubeless nature and wide rim. Wide-base radial truck tire has been widely used for trucks, such as drive wheel, trailer wheel and semi-trailer wheel.

A technical characteristic feature of the Michelin X-one wide-base radial truck tire is its 0° belt crown part that is, 400 m of non-joint wires to 0° angle continuous winding on the crown. This feature guarantees tread stability, even distribution of stress, better clutching performance, and uniform tread wear and extended mileage.

Compared with conventional tires and dual tires, wide-base radial truck tire is lighter in weight, with larger load carrying capacity and requires less installation space. However, the manufacturing process of wide-base radial truck tire is more complex, and it requires high precision. In the actual building process of wide-base radial truck tires, carcass ply bending is one of the most common defects, which directly affects tire performance. The "trial and error method" is used to optimize design parameters with the object of solving the carcass ply bending problem in the design process. Yueyao Ping effectively solved the carcass ply bending problem by controlling the building design parameters. Zhe Pu reduced the carcass ply bending problem by adjusting tire components laminating strength in the building process The mentioned methods have drawbacks of large test numbers with usually low precision, as well as narrow scope of application, and scanty obtainable information.

There are three building drum in the tri-drum single stage building machine for all steel heavy truck tire: the carcass drum (main drum), which is bonding the components of the sidewall, the inner, the bead, the abrasion, and the carcass; the belt drum (auxiliary drum), which is joining the components of belts and tread. After gluing the carcass drum components and the belt drum components, and these components are translated to the building drum by transferring ring; the building drum, which complete the stereotype, compaction, and form a green tire.

The belt drums are generally composed of several arc blocks, and the drum diameter of the belt is adjusted by replacing the segments or adjusting nuts. The drums are usually cylindrical, which results in different rates of belt elongation at different locations for the duration of the building process. The crown's elongation rate is high, but that of the sidewall is short. Nevertheless, the width of the belt of wide-base radial truck tire is wider, and the force of the cord is not uniform when the tire belt/crown is glued, especially in the case of 0° cap plies winding technology. FIG. 16 presents the cross section of a wide-base radial truck tire with 0° cap plies winding technology. In the center of the crown as shown in FIG. 16, the band tightening effect is stronger than at the belt ends. In the vulcanized tire stereotypes, since the radial tire carcass cord angle is set to 90°, the cord is assembled by rubber material implying that, a slight stretch will deform the belts, leading to the rubber flow to the shoulder, and this in turn will result in uneven tires, affecting the tire structure and uniformity.

Since tire building design acts as a bridge between tire semi-finished components design and the finished tire, the accuracy of building design directly affects the qualities of finished tire. The reason why it is prudent to control the large rubber flows in tire building process. In order to manage the rubber large flow during the building process by way of ensuring tire manufacturing accuracy and improve product consistency, tire designers usually use "trial and error" method to adjust the building design. However, this method is costly and time consuming. Consequently, a more precise design method of semi-finished components is essential.

In the past decades, tire CAE technology has developed rapidly, and the wide use of numerical methods to simulate the tire building process is predominant. The invention document of CN101923589A discloses a simulation technique for constructing a wide-base radial truck tire. Du Xaiowei conducted the finite element simulation of a 385/55 R22.5 steel-wide base radial tire using ABUQUS software. The simulated structure is in good agreement with the actual structure each other. Gao Ming, from Triangle Tire Co., Ltd., is employed to simulate the building process of 215/35R18 tire, as well as the influence of design process parameters on the shape of tire are analyzed. The numerical simulation of the tire building processes is mainly used to visualize the building process of tires outside the vulcanization tank. It is mostly as well employed to analyze the effects of different tire design and building parameters on the finished tires in conventional models of non-wide base radial tires.

Again, the determination method of the carcass bending for the wide-base radial truck tire, the analysis for the rubber flow abnormalities and control method have not yet been publicly reported. Moreover, there is no relevant research on semi-finished tire parts to improve the quality of finished tires.

SUMMARY OF THE INVENTION

Based on the numerical simulation of the building process of the wide-base radial truck tire, the shape of the carcass ply is determined by the carcass rebar force value during the building process. In other words, if the carcass rebar force has negative value, the carcass ply is bending; otherwise, if the carcass rebar force is all positive value, the carcass ply is no bending. The building parameters are adjusted until, until the carcass rebar force is all positive, that is, there is no bending in carcass ply.

Based on the numerical simulation of the building process of the wide-base radial truck tire, the structural parameters of the belt drum of the tire building machine are determined based on the anomalous phenomenon of the crown rubber flow in the building process.

The design method of the semi-finished components is determined by numerical simulation of the building process of the wide-base radial truck tire. Through applying the opposite boundary to tire building process, the shape and design parameters of the semi-finished components are determined. The boundary conditions include the roll pressure, the inflation pressure in building process, the friction coefficient among the rubbers and the drums.

The present invention is achieved by the technical means described as below:

The method of the present invention utilizes the positive and negative of the carcass rebar force value at the crown of the finished tire to determine whether or not the carcass ply is bending. The patent invention has the advantages of wide application range, high precision and generalization ability, and it can overcome the shortcomings of the traditional trial and error method, thus effectively improving rubber flow and solving the bending problem of the carcass ply of the wide-base radial truck tire, and improving the tire building quality.

In addition, the proposed method, which is control rubber anomalous flow, is feasible in the tire production process, since only the original drum is coated with a curved film which satisfies the outer surface shape parameter of the curved drum.

The invention also has the advantages of wide application range and high precision, which can overcome the defects of the traditional method and design the material distribution map of the tire semi-finished components accurately, greatly improve the consistency of the tire distribution of the finished tire and the theoretical design tire, reduce the numbers of tire test, reduce tire manufacturing costs and rise productivity.

BRIEF DESCRIPTION OF THE DRAWINGS

FIG. 5(a) shows the carcass drum components; FIG. 5(b) shows the belt drum components; FIG. 5(c) shows the triangular rubber components.

FIG. 6(a) shows the components before the gluing; FIG. 6(b) shows the components after the gluing.

FIG. 8(a) is tire fixation; FIG. 8 (b) is bead move, FIG. 8(c) is inflation, FIG. 8(d) is sidewall anti-packet, FIG. 8 (e) is green tire in two dimensions; FIG. 8 (f) is green tire in three dimensions.

FIG. 9(a) shows the assembly of tire and vulcanized molds, and FIG. 9(b) is building process, FIG. 9(c) is the finished tire.

FIG. 14(a) is the sample tire I; FIG. 14(b) is the sample tire II.

FIG. 17(a) is closed mold; FIG. 17(b) is vulcanization.

FIG. 22(a) is closed mold; FIG. 22 (b) is vulcanization.

FIG. 24 is the comparison results of belts rebar force when using the plane surface drum and the curved surface drum.

FIG. 27(a) is tread subsystem position, FIG. 27(b) is the shape of semi-finished tread subsystem, FIG. 27 (c) is the shape of semi-finished tread subsystem after modified.

FIG. 2 8(a) is carcass subsystem position, FIG. 28(b) is the shape of semi-finished carcass subsystem; FIG. 28(c) is the shape of semi-finished carcass subsystem after modified.

FIG. 29(a) is triangular subsystem position; FIG. 29(b) is the shape of semi-finished triangular subsystem; FIG. 29(c) is the shape of semi-finished triangular subsystem after modified.

FIG. 30(a) shows the shape and distribution of the components of the simulation section, and FIG. 30(b) shows the shape and distribution of the components of the theoretical section.

Where:

1—Tire theoretical structure; 2—Part I: tread sub-system; 3—Part II: carcass sub-system; 4—Part III: triangular sub-system; 5—auxiliary; 6—tread; 7—carcass drum; 8—bead;

9—strength; 10—inner; 11—carcass; 12—shoulder; 13—soft-apex; 14—hard-apex.

DETAILED DESCRIPTION

The present invention will now be described in further detail with reference to the accompanying figures and specific examples, but the scope of the present invention is not limited thereto.

Figure 1:
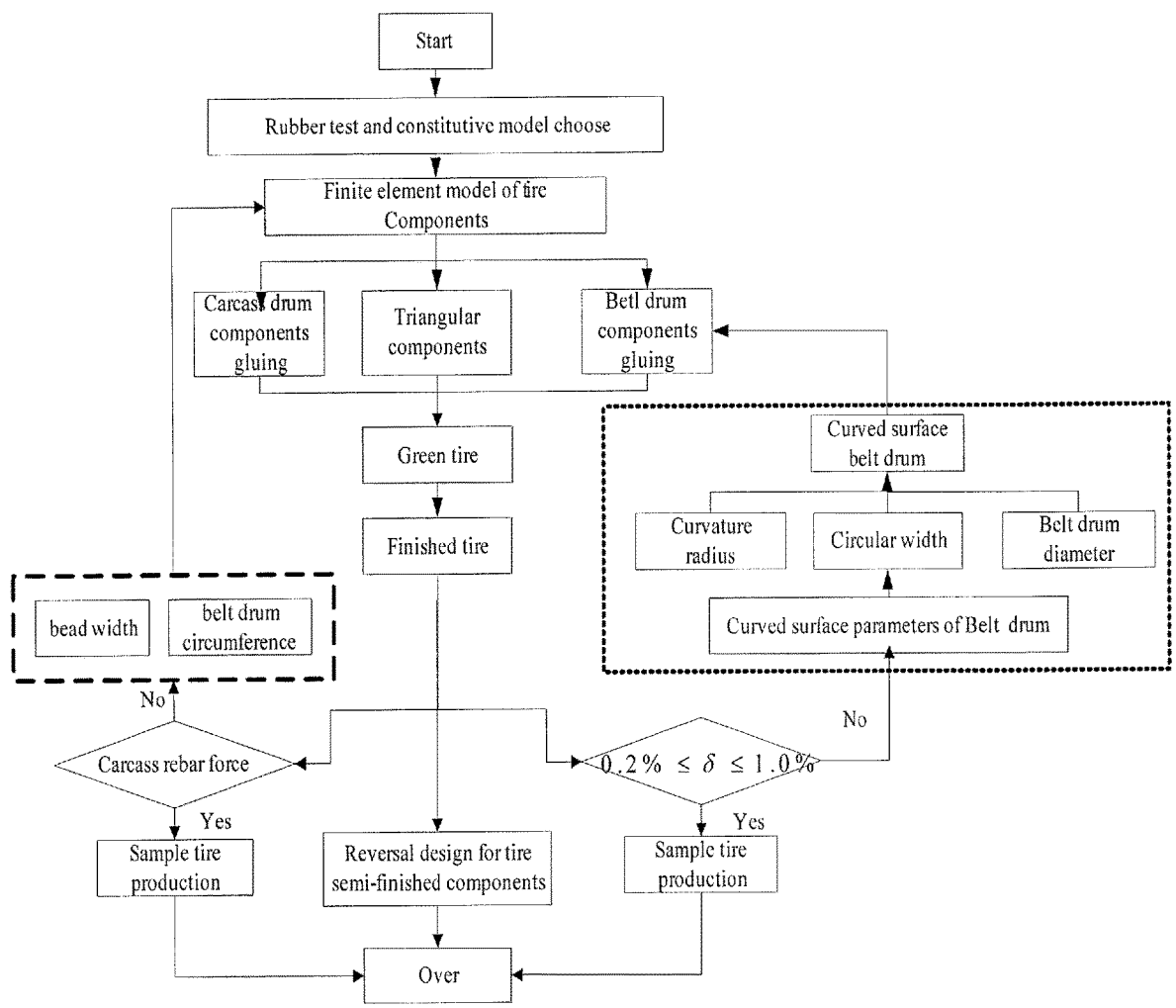
FIG. 1 is a flow chart of the present invention.

As shown in FIG. 1, the improved method for wide-base radial truck tire production process according to the present invention comprises the following three steps:

Based on the numerical simulation of the building process of the wide-base radial truck tire, the shape of the carcass ply is determined by the direction of carcass rebar force in the tire crown during simulation process. In other words, if the carcass rebar force value is all positive value, it means there is no bending in carcass ply; if the carcass rebar force value has negative value, it means there is bending in carcass ply. The building parameters are adjusted until the carcass rebar force value is all positive, then the carcass ply is no bending.

Based on the numerical simulation of the building process of the wide-base radial truck tire, the structural parameters of the belt drum of the building machine are determined based on the anomalous phenomenon of the crown rubber flow in the manufacturing process.

Based on the numerical simulation of the building process of the wide-base radial truck tire, applying the opposite boundary to tire building process, the shape of the semi-finished components is reversal design. Consider of the extrusion die of the rubber, the shape of the semi-finished components are modified, thus the design method of the semi-finished components of the tire is presented.

To illustrate the specific implementation steps, Firstly, the building process of a 385/55R22.5 wide-base radial truck tire is taken as the example, and the building method is verified by test tire components sizes at different positions;

Secondly, based on the simulation method, the carcass ply shape of the 385/55R22.5 wide-base radial truck tire is determined. By optimizing the belt drum circumference and the bead width, the two new sample tires are simulated and analyzed, to make sure the carcass rebar force value are all positive. By the comparison of the sample tires carcass ply shape, it is show that there is no bending in the crown.

Thirdly, the curved surface belt drum is proposed to solve rubber abnormal flow problem of the 435/50 R19.5 wide-base radial truck tire, which result into the difference of material distribution between the real manufacture structure and the theoretical structure. From the comparison results of the tire using the plane belt drum and the curved surface belt drum respectively, it is show that the rubber abnormal flow disappeared.

Fourthly, the reversal design process of a 385/55R22.5 wide-base radial truck tire is taken as the example; by the comparison of the original design method of the tire semi-finished components, it is show that the reversal design method of the tire semi-finished components has a great influence on improving tire product uniformity.

Simulation of Building Process of Wide-Base Radial Truck Tire

S1: Tire Rubber Mechanical Test and Constitutive Model Choose

Figure 2:
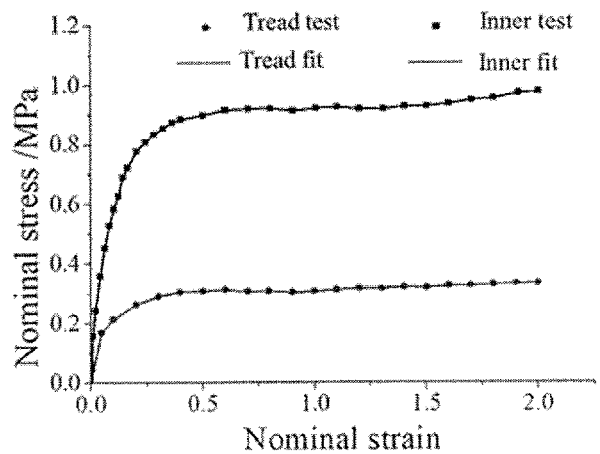
FIG. 2 shows the uniaxial tensile test and data fitting.
Figure 3:
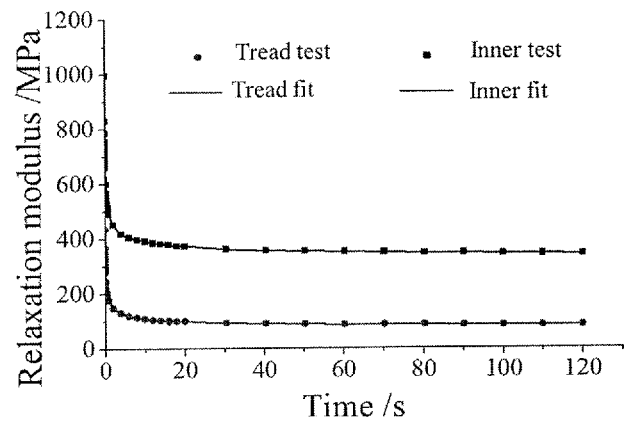
FIG. 3 presents the rubber shear relaxation test and data fitting.

The shear relaxation modulus and stress-strain curve of each rubber of tire are obtained by shear test and the uniaxial tensile test. The reference standards of the shear test and uniaxial tensile test are ISO 289-1:2005 and ISO 37:2005 respectively. The generalized Maxwell model and Marlow hyper-elastic model are used to characterize the viscous behavior and hyper-elastic property of the unvulcanized rubber. Because there are many type rubbers in tire components, taking the tread rubber and the inner rubber as the examples, it is used to examine the validity of rubber mechanical test and constitutive model. FIG. 2 shows the uniaxial tensile test curves for the tread rubber and the inner rubber. FIG. 3 shows the shear relaxation test curve of the tread rubber and the inner rubber.

Figure 4:
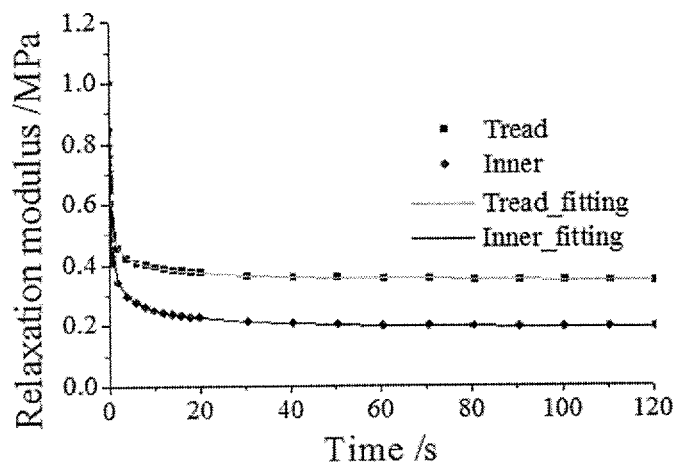
FIG. 4 is the fitting of relaxation modulus using generalized Prony series expansion

ABAQUS assumes that the viscoelastic material is defined by a Prony series expansion of the dimensionless relaxation modulus. For the uncured rubber component investigated, three Maxwell elements result in satisfying results. Thus, the viscous parameters $g_1$, $g_2$, $g_3$ and $t_1$, $t_2$, $t_3$ in Prony model can control the influence of the three Maxwell elements. As shown in FIG. 4, the test data curve is in good agreement with the curve fitted by the generalized Prony model, which suggests that the generalized Prony could express the viscoelasticity mechanical properties of the rubber component properly. The tread and inner rubber parameters for the generalized Prony model are represented in Table 1.

TABLE 1

| Material parameters for the generalized Prony model | | | | |
|---|---|---|---|---|
| | Tread | | Inner | |
| | $g_j$ | $\tau_j$ | $g_j$ | $\tau_j$ |
| 1 | 0.279 | 0.0023 | 0.299 | 0.0029 |
| 2 | 0.248 | 0.375 | 0.328 | 0.415 |
| 3 | 0.121 | 9.957 | 0.175 | 8.539 |

S2: Establishment of Finite Element Model for Tire Components (1) According to the build process of the tri-drum single stage building machine, the 385/55R22.5 wide-base radial truck tire mainly comprises three components: the carcass drum components, the belt drum components and the triangular rubber components. The carcass drum components comprise a sidewall rubber, an abrasion rubber, a plastic, an inner layer, a strength layer, and a carcass layer and shoulder rubber. While the belt drums components are provided with the belt1, belt2, belt3, belt0, and tread rubber; the triangular rubber components comprise a bead, a hard-apex rubber and a soft-triangular rubber, and a rubber plastic. To reduce the computing time, half of the model is chosen to simulate the tire building process.

Figure 5:
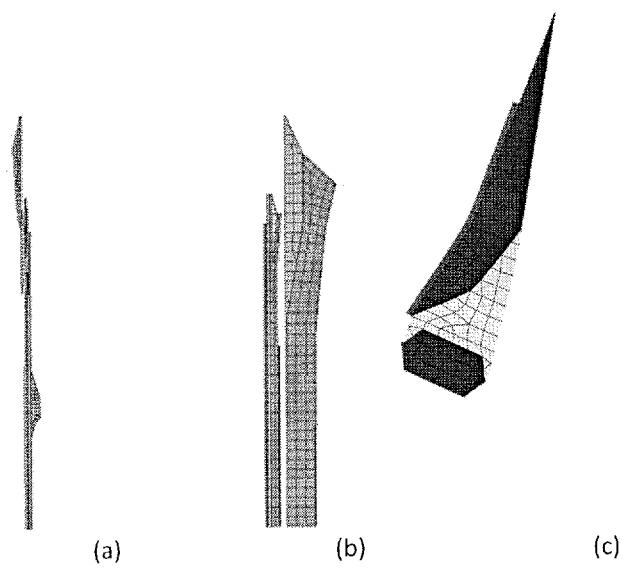
FIG. 5 presents a finite element model tire components.

According to the building requirements, the finite element model of all the tire components is established. But because of the hard-apex rubber and the soft-apex rubber are co-extruded by two rubber extruder group, the contact relationship of the triangular rubber components are established directly in the Hypermesh Software. The wide-base radial truck tire is simplified as an axisymmetric model. The rubber components are discredited with CGAX3H and CGAX4H element which model incompressible rubber behavior, the reinforcement materials in the carcass, the belts and enhancement plied are modeled with SFMGAX1 elements that carry rebar layers, which is embedded in continuum rubber components elements. The bead is defined as isotropic material described by C3D8R element; the carcass drum and the belt drum are modeled by the analytical rigid body respectively. All the finite element models of the tire components are meshed by using Hypermesh software. Then all the finite element models of the tire components are imported into Abaqus Software. FIG. 5(a) shows the finite element model of the carcass drum components, FIG. 5 (b) shows the finite element model of the belt drum components, and FIG. 5 (c) shows the finite element model of the triangular rubber components. The mesh size is controlled within the range of 3-5 mm for the carcass drum components. The mesh size is controlled within the range of 3-7 mm for the belt drum components. The mesh size is controlled within the range of 4-8 mm for the triangular rubber components.

(2) Contact simulation: during tire building process, the adhesion between the various components is very strong, so the direct constraint method of coulomb friction is used to simulate the contact behavior between the different tire components.

Figure 6:
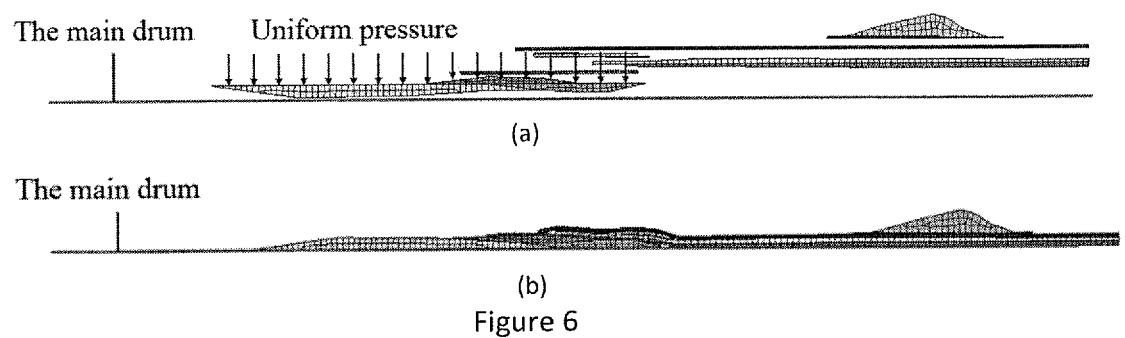
FIG. 6 presents the gluing process of the carcass drum components.

S3: Tire Building Process Simulation (1) Gluing of Components on the Carcass Drum The tire sidewall, abrasion, filler, inner, down inner, strength, carcass, shoulder are glued sequentially on the carcass drum. The purpose of this process is to bond different components using the cohesive property of rubber components. In the process of gluing, the finite element model of each component is established according to the tire construction design. The uniform pressure is sequentially applied on the surface of each rubber component to simulate the gluing process. The results are shown in FIG. 6(a) and FIG. 6(b).

(2) Gluing of Components on the Belt Drum

Figure 7:
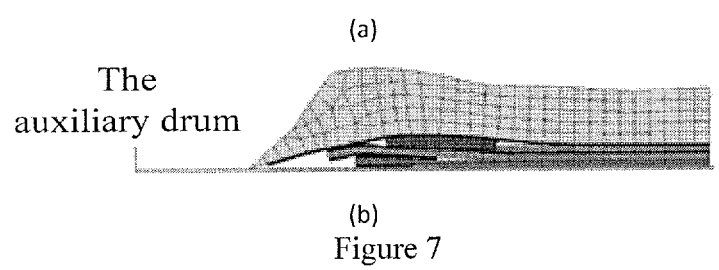
FIG. 7 presents the gluing process of the auxiliary drum components, with FIG. 7 (a) showing the tread component positions before the gluing, and FIG. 7 (b) showing the tread component positions after the gluing.

The components, including the belt1, belt2, belt3, belt0 and the tread are glued sequentially on the belt drum. During the process of simulation, each component is analyzed in turn. The process of attaching is realized by exerting two-stage uniform pressure when the tread is glued. Firstly, the crown components are glued using Pressure 1, then the shoulder components are glued by Pressure 2. The pressure in the shoulder pad location (Pressure 2) is larger than that of in the center of tread (Pressure 1), which is determined by the practical manufacturing pressure. The results are shown in FIG. 7(a) and FIG. 7(b).

(3) The building process of the green tire

Figure 8:
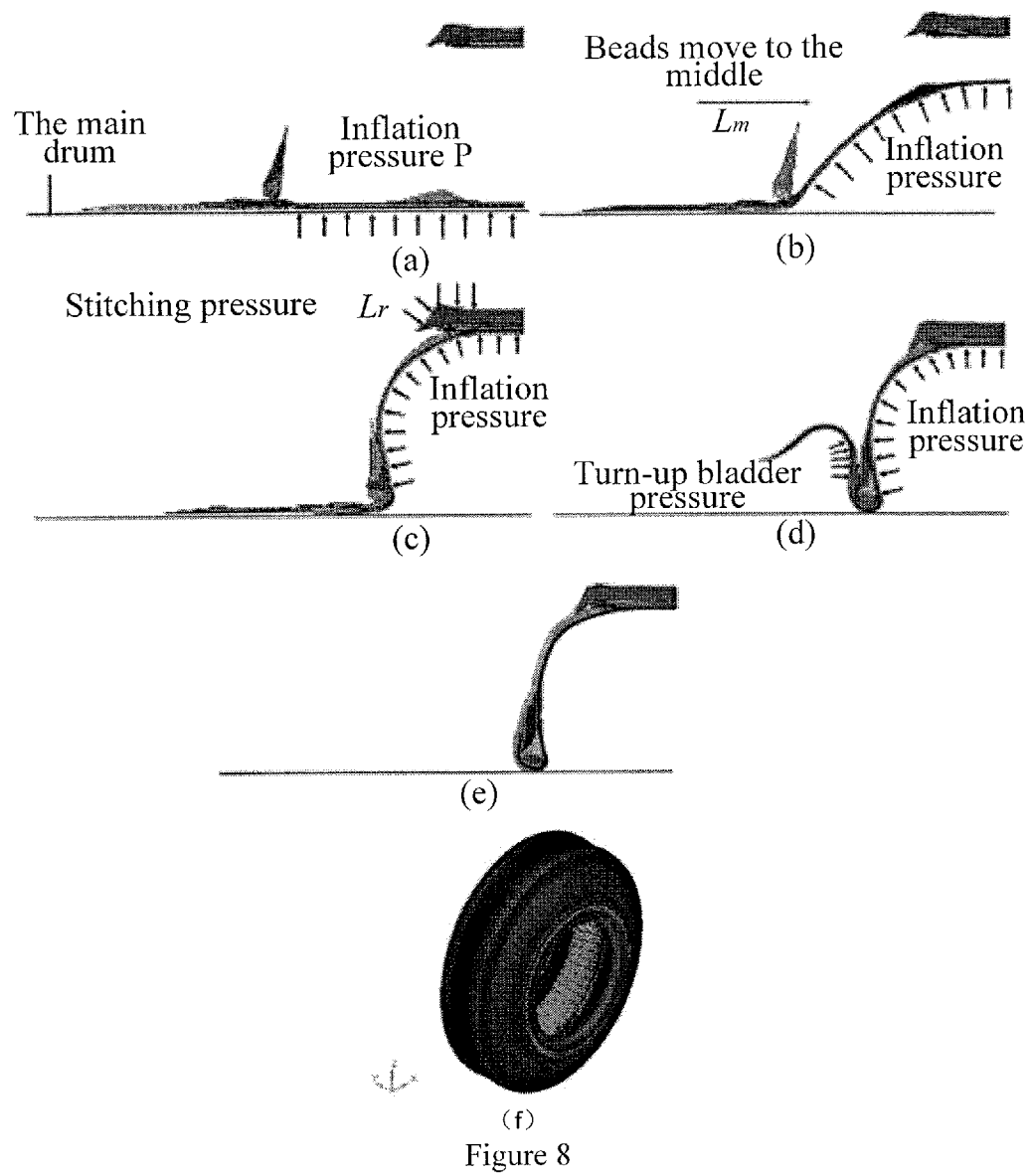
FIG. 8 illustrates the green tire building process.

The building process of the green tire is performed in three stages: inflation, stitching and sidewall turn-up. First, the components on both the carcass drum and belt drum, and the bead are positioned as shown in FIG. 8(a); coinciding with increasing inflation pressure P (0.1 MPa-0.2 MPa) applied on the tire inner, the beads are displaced ($L_m$) (FIG. 8(b)). Secondly, when the contact between the carcass and belts is attained, the stitching pressure ($L_r$) acts on the tread, and the belts complete gluing (in FIG. 8c). Third, the turn-up bladder pressure P (0.2 MPa-0.4 MPa) is stepwise applied on the surface from the abrasion to the sidewall until the turn-up process is finished (FIG. 8(d)). Finally, the inflation pressure is reduced to zero. The two-dimensional final shape of the green tire is presented in FIG. 8(e), and the three-dimensional final shape of the green tire is presented in FIG. 8(f).

(4) the Building Process of the Finished Tire

Figure 9:
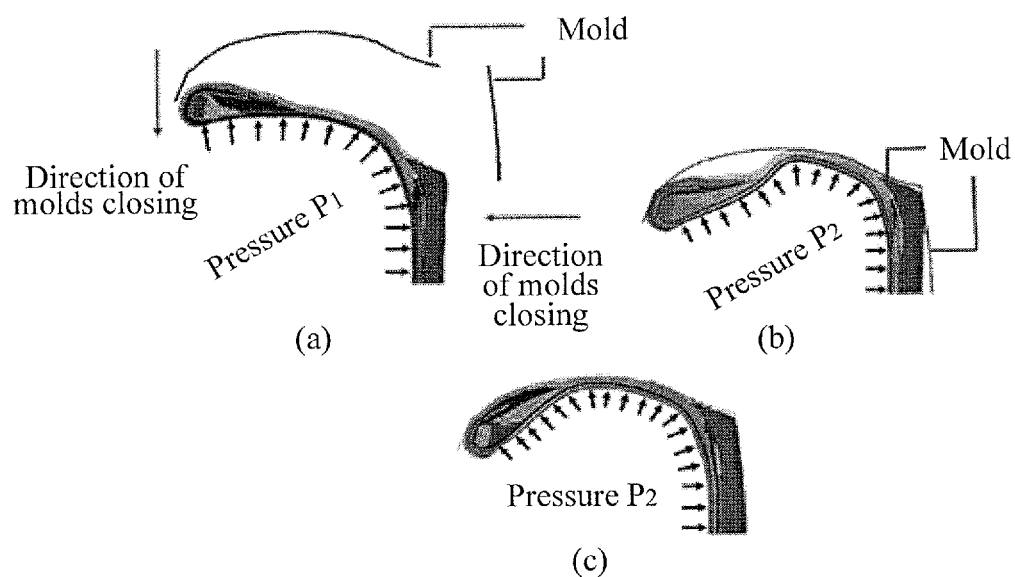
FIG. 9 presents the building process of the green tire in vulcanization machine.

The molding process of the tire curing is carried out in the capsule vulcanizing machine. The green tire is a deformable body, and the curing mold is simulated as rigid body (FIG. 9(a)). First, the bladder is evacuated, the green tire is then set outside of the bladder with an inflated pressure of 0.9 MPa (Pressure P1), and the green tire and bladder are held together by rubber friction. Second, the molds are closed, and then, the internal pressure of the inner surface is increased to 2.5 MPa (Pressure P2) until the process of the tire curing complete, as indicated in FIG. 9(b) and FIG. 9(c). To simplify the analysis, the influence of the curing bladder is neglected, and the uniform pressure P1 and P2 are directly applied on the inner surface of the green tire.

(5) Experimental Verification of Tire Building Simulation

To validate the tire building simulation, the thickness of tire components in five locations ((A-A, B-B, C-C, D-D and E-E)) (FIG. 10) are selected for checking simulation results, and the analysis of thickness of the five locations are presented in Table 2, 3, 4, 5 and 6 respectively. The simulation error is defined as the thickness difference between the simulated structure and that of the real structure. Similarly, the manufacture error is defined as the thickness difference between the real structure and the theoretical structure.

As shown in Table 2-6, the analysis of thickness indicates that the simulation structure material distribution is particularly similar to the real structure, which proves that the tire building process simulation method is effective. However, the error between the real structure and the theoretical structure is relatively large, especially in the tread, tire shoulder and apex. Moreover, the shapes of these components have a great influence on the material distribution of the finished tire.

TABLE 2

Thickness comparison of A-A location

| A-A | Thickness of simulation structure [mm] | Thickness of real structure [mm] | Thickness of theoretical structure [mm] | Simulation error/% | Manufacture error/% |
|---|---|---|---|---|---|
| tread | 18.53 | 20.00 | 17.65 | 7.4 | 13.31 |
| Belt1 | 2.65 | 2.40 | 2.32 | 10.4 | 3.44 |
| Belt2 | 2.87 | 2.60 | 2.45 | 10.3 | 6.12 |
| Belt3 | 1.81 | 2.00 | 2.05 | 9.5 | 2.44 |
| carcass | 1.78 | 2.00 | 3.05 | 11.0 | 34.43 |
| inner | 3.38 | 3.80 | 3.20 | 11.1 | 18.75 |

TABLE 3

Thickness comparison of B-B location

| B-B | Thickness of simulation structure [mm] | Thickness of real structure [mm] | Thickness of theoretical structure [mm] | Simulation error/% | Manufacture error/% |
|---|---|---|---|---|---|
| tread | 17.07 | 16.80 | 14.43 | 1.61 | 16.42 |
| Belt0 | 3.62 | 3.50 | 3.18 | 3.43 | 10.06 |
| Belt1 | 1.93 | 2.05 | 2.00 | 5.85 | 3.50 |
| Belt2 | 2.23 | 2.50 | 2.00 | 8.92 | 12.5 |
| carcass | 2.02 | 2.00 | 3.05 | 1.00 | 34.43 |
| inner | 2.90 | 3.05 | 3.20 | 4.92 | 9.38 |

TABLE 4

Thickness comparison of C-C location

| C-C | Thickness of simulation structure [mm] | Thickness of real structure [mm] | Thickness of theoretical structure [mm] | Simulation error/% | Manufacture error/% |
|---|---|---|---|---|---|
| tread | 24.01 | 24.50 | 22.00 | 2.00 | 11.36 |
| shoulder pad | 7.82 | 7.80 | 6.11 | 0.26 | 27.66 |
| carcass | 2.15 | 2.50 | 3.05 | 14.0 | 18.03 |
| inner | 3.17 | 3.10 | 3.20 | 2.26 | 3.12 |

TABLE 5

Thickness comparison of D-D location

| D-D | Thickness of simulation structure [mm] | Thickness of real structure [mm] | Thickness of theoretical structure [mm] | Simulation error/% | Manufacture error/% |
|---|---|---|---|---|---|
| sidewall | 6.05 | 6.40 | 6.20 | 5.4 | 3.22 |
| carcass | 2.66 | 2.50 | 3.05 | 6.4 | 18.03 |
| inner | 3.49 | 4.00 | 3.20 | 12.5 | 25.00 |

TABLE 6

Thickness comparison of E-E location

| E-E | Thickness of simulation structure [mm] | Thickness of real structure [mm] | Thickness of theoretical structure [mm] | Simulation error/% | Manufacture error/% |
|---|---|---|---|---|---|
| abrasion | 5.25 | 6.50 | 4.70 | 19.23 | 38.30 |
| strength | 3.05 | 2.90 | 3.00 | 5.17 | 3.33 |
| carcass | 2.62 | 2.50 | 3.05 | 4.80 | 8.19 |
| apex | 18.22 | 17.50 | 14.21 | 4.11 | 23.15 |

Determination Method of the Carcass Ply Shape

S4: Carcass Rebar Force in the Finished Tire Analysis

The carcass rebar force of the finished tire 385/55R22.5 at the crown is derived from simulation process, and if the carcass rebar force value is all positive value, the carcass ply is no bending; if the carcass rebar force has negative value, the carcass ply is bending.

Figure 10:
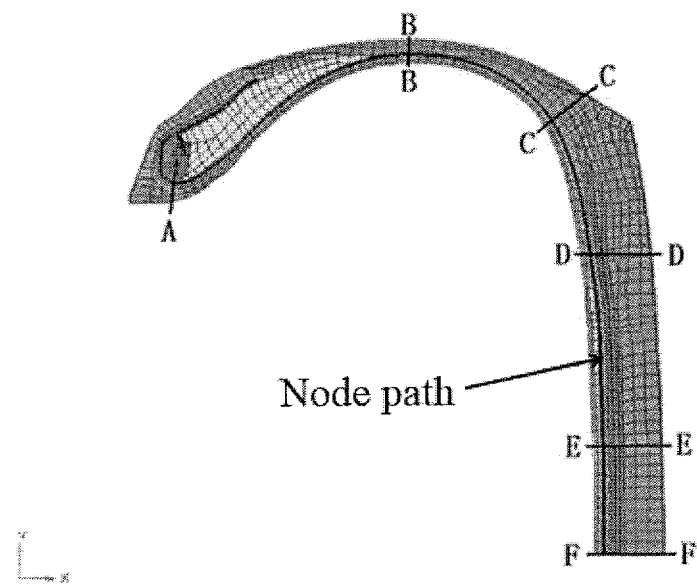
FIG. 10 shows the thickness of different position in the finished tire.
Figure 11:
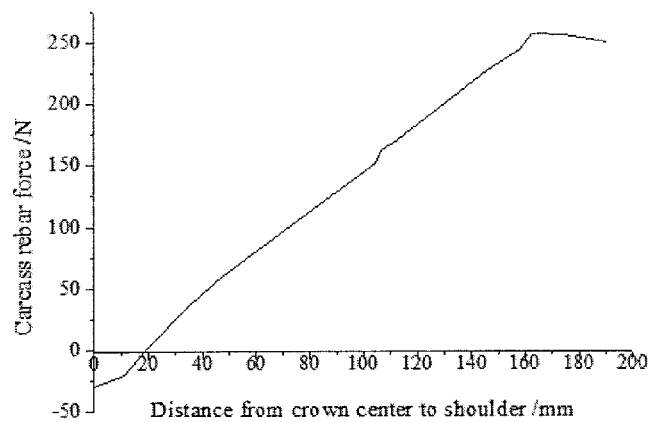
FIG. 11 shows the carcass rebar force between C-C and F-F.
Figure 12:
FIG. 12 shows the carcass ply is bending in the actual sample tire.

Specifically, a node path is created for extracting the carcass rebar force at the crown of the finished tire, as shown in FIG. 10. The rebar force distribution along the width of the CC-FF segment within the carcass is shown in FIG. 11. It can be seen from FIG. 11 that the carcass rebar force at the center of the crown is negative. According to the method of the present invention, it is determined that the carcass ply at the finished tire crown should be bending. The actual tire is split and the shape of the carcass ply shape is shown in FIG. 12. It can be seen that the carcass ply is bending at the tire crown, which is consistent with the predicted result of the method described in the present invention.

In order to put the proposed method into practice to guide actual tire building, the building design parameters of the belt drum circumference and the bead width are adjusted. By optimizing the belt drum circumference and the bead width, the new two sample tire are simulated and analyzed, to make sure the carcass rebar force are all positive. For the sample tire I, the belt drum circumference is 2674 mm, which add 4 mm for the original size, and the bead width is 786 mm, which decrease 4 mm for the original size. For the sample tire I, the belt drum circumference is 2674 mm, which add 4 mm for the original size, and the bead width is 782 mm, which decrease 8 mm for the original size. The carcass rebar force in the sample I and the sample II are shown in the FIG. 13.

Figure 13:
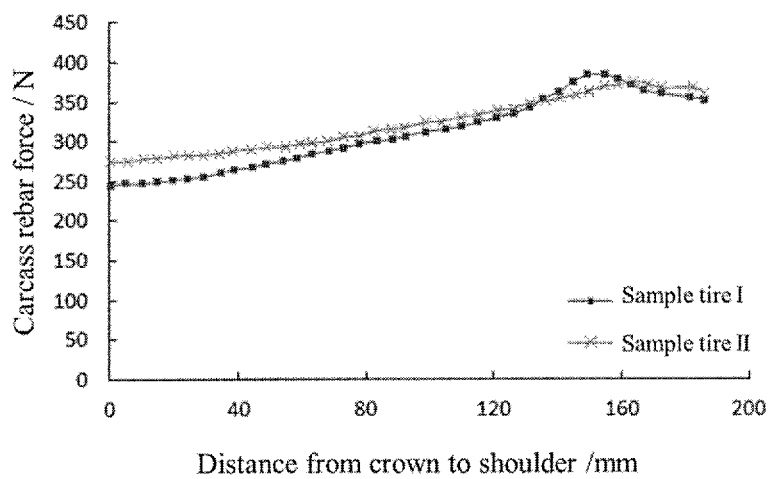
FIG. 13 shows the carcass rebar force during the shoulder and crown (C-C to F-F) after optimum building parameters.
Figure 14:
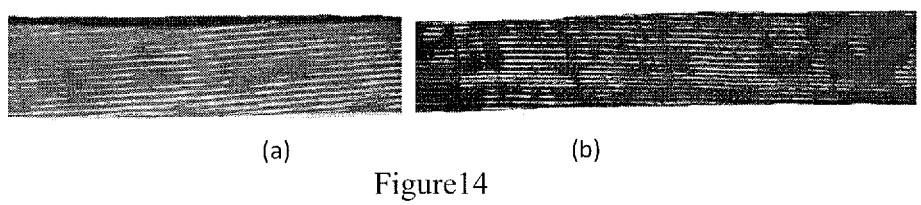
FIG. 14 shows the carcass ply shape after optimizing the building parameters.

As seen in the FIG. 13, the carcass rebar force value in the two sample tires are all positive, which means that the carcass ply in the two sample tires will be no bending. According to the adjusted building parameters, the two sample tires are manufactured and split. The shapes of the carcass ply in the two sample tires are shown in FIG. 14, which shows that the carcass ply has no bending, and basically consistent with the predicted results. This shows that the method of determining the bending of the carcass ply in the finished tire is accurate, which can meet the demand of the actual engineering application, and can be popularized in the tire industry to provide guidance for the building process of wide-base radial truck tire.

Design Method of the Curved Surface Belt Drum of Tire Building Machine

S5: Design of the Curved Surface Belt Drum

Figure 15:
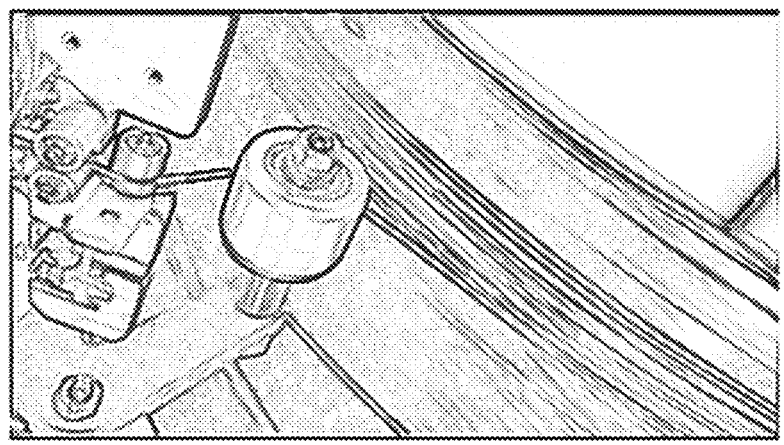
FIG. 15 shows the technology of 0° cap plies winding in wide-base radial truck tire.
Figure 16:
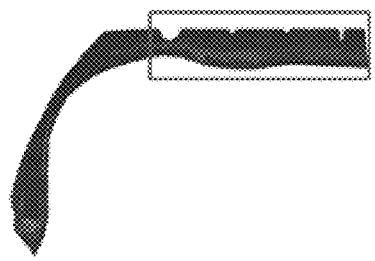
FIG. 16 shows the inner unevenness in tire cavity.

The crown of a wide-base tire (435/50R19.5) has five cord layers, and the belt3 is made using the 0° cap plies winding technology (FIG. 15). In other words, the successive belt3 have 0° winding in the tire crown so that the 0° cap plies winding technology can maintain the tire ground pressure distribution uniformity and improve the grip and wear performances. However, because of the particularity of the 0° cap plies windings technology, the belt3 ply is tied severely, and it has larger stiffness. During the actual tire building process, the crown rubber component does not flow easily from the middle to the side, and this results in the inner unevenness in the tire cavity such that the abnormal crown is generated (which is shown in FIG. 16), which leads to inner unevennes.

Figure 17:
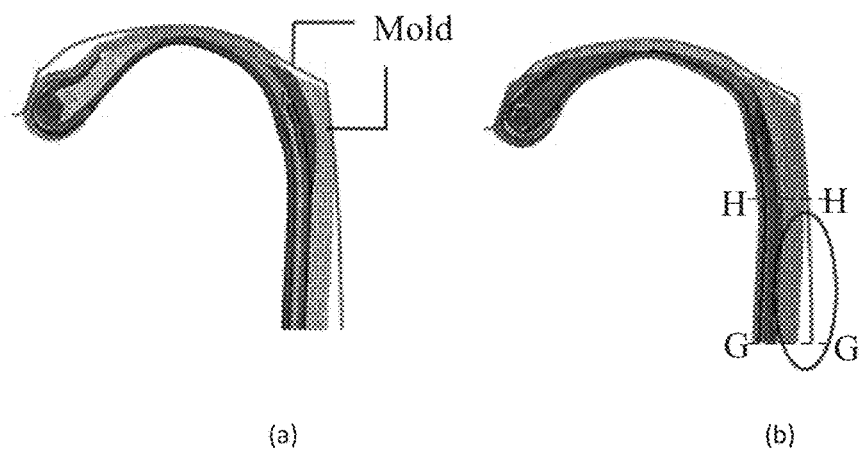
FIG. 17 presents building process of the green tire in vulcanization machine with the plane belt drum.
Figure 18:
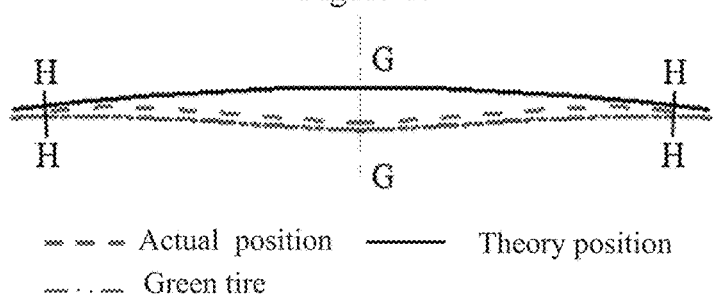
FIG. 18 shows the position change of the belt3 using the plane surface drum

The simplified building process of the 435/50R19.5 green tire with the plane drum in the vulcanizer is shown in FIG. 17. It can be seen from FIG. 17 that the shoulder component is in contact with the mold; however, the center of the crown component is not contact with the mold. The location of belt3 in the building process and its actual position in the tire are shown in FIG. 18. During the building process, the shoulder contacts the mold firstly, and thus, the building pressure is mostly born by the shoulder; the middle of the crown is offset to the mold, and the belt ply bears the building pressure. If the building pressure increases, the belt ply will not move to the actual assigned position. Furthermore, in order to fill the gap between the crown and mold, the tread component rubber will flow from the shoulder to the middle crown due to the high dynamic flow property of the unvulcanized rubber. Thus, the abnormal crown present in FIG. 16 is generated.

Figure 19:
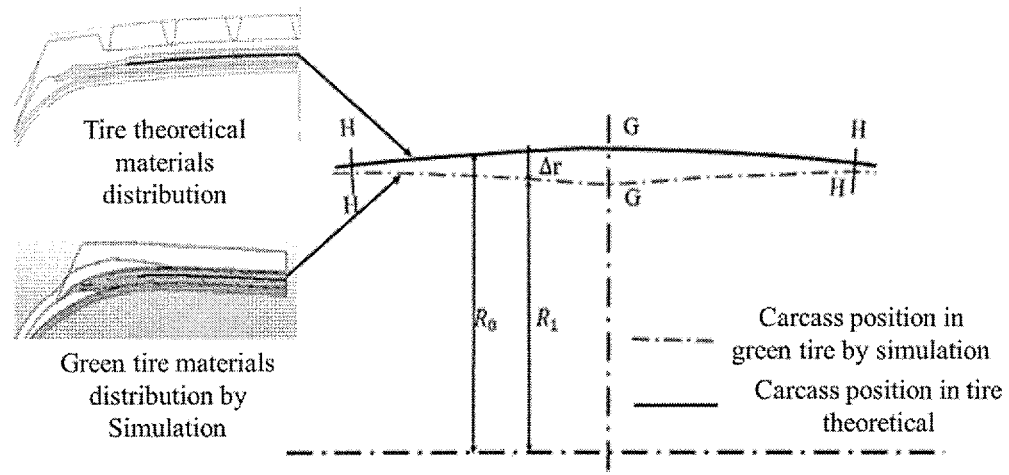
FIG. 19 shows the expectant expansion ratio of the belt3 with using 0° cap plies winding.

FIG. 19 shows that the comparison of the material distribution between the green tire and the theoretical tire. It can be seen from FIG. 19 that the distance between the belt3 in the green tire and in the theoretical tire is Δr in warp direction, the elongation ratio of belt3 is $$\delta = \frac{\Delta r}{R_1} = \frac{R_0 - R_1}{R_1} \times 100\%,$$

where $R_1$ and $R_0$ is the belt3 radials in the green tire structure and in the theoretical tire respectively.

To solve the abnormal inner unevenness problem (FIG. 16), the curved surface belt drum design method is provided. The surface of the belt drum is not a plane but is instead curved. By virtue of the curved surface belt drum, the extensional quantity of 0° cap plies winding belt at different positions will keep in uniformity extended ratio during the green tire building process, and thus guarantee equal force in the middle crown.

Figure 20:
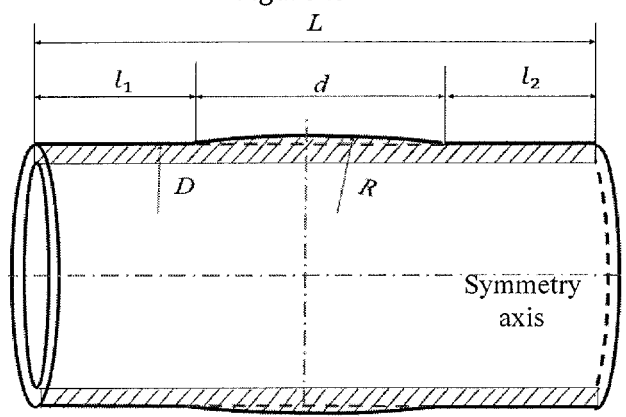
FIG. 20 presents the design parameters of the curved surface belt drum.

The cross-sectional profile of the belt drum consists of two straight lines and a curved line, which are shown in FIG. 20. The width d of the curved line is 80%-120% of the width of the belt3 in the tire theoretical material distribution; the radius of curvature R of the curved line is 70%-130% of the radius of curvature of the belt3; the diameter of the belt drum is D, and the length of the two straight segments are $l_1$ and $l_2$ respectively:

$$D = \frac{D_1}{1+\delta} \text{ and}$$

$$l_1 = l_2 = \frac{L-d}{2},$$

Where L is the total width of belt drum, and D, is the radius of curvature of the belt3 measured in the tire theoretical material distribution; the elongation ratio 3 of belt3 is 0.2%-1.0%;

The width of the curved line width d, the radius of curvature of the curved line R and the diameter of the belt drum D can be adjusted to meet the belt3 expected elongation ratio within 0.2%-1.0%.

In order to better determine the shape parameters of the curved surface belt drum, it is preferable to determine the main design parameters of the curved surface belt drum by the simulation of tire building process S3.

Figure 21:
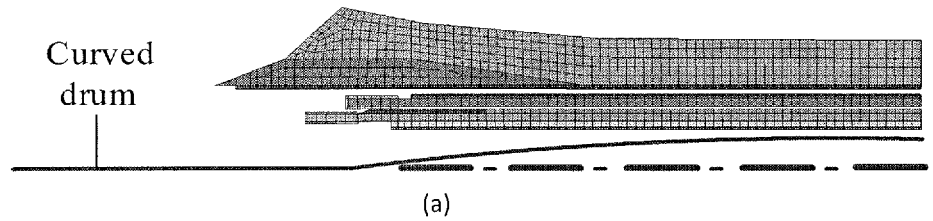
FIG. 21 shows the gluing process of the tread components using the curved surface belt drum, with FIG. 21(a) showing positions of tread components on the curved surface belt drum, and FIG. 21(b) showing results of the gluing process of tread components on the curved surface belt drum.
Figure 22:
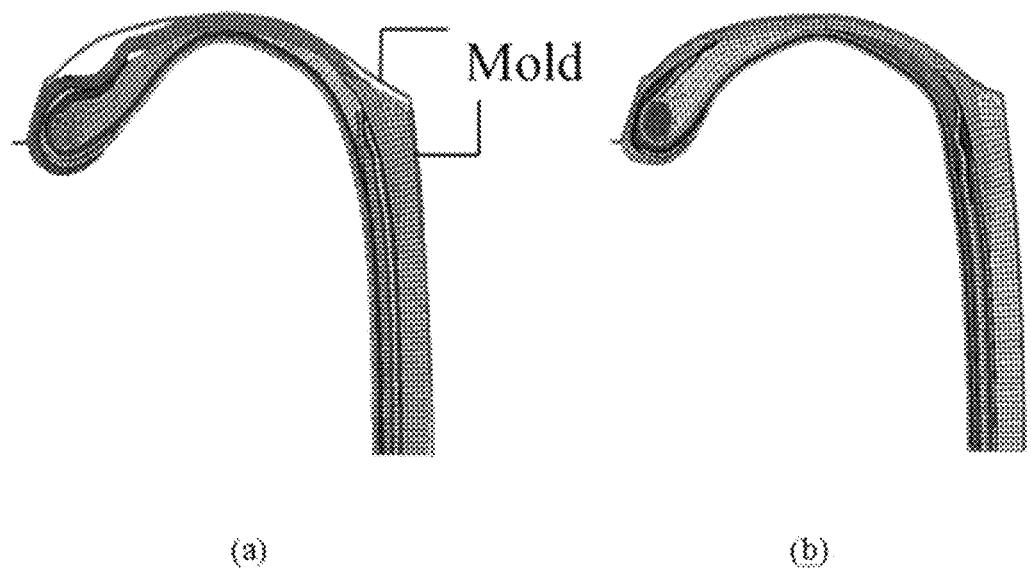
FIG. 22 shows the building process of the green tire in vulcanization machine with the curved surface drum.

The tire building process using the curved surface belt drum is presented via the simulation method in S3. The gluing of the tire crown components on the belt drum is shown in FIG. 21. It can be seen from FIG. 21 that the belts are arc-shaped after gluing is completed. The building process in the vulcanizer is shown in FIG. 22. As shown in FIG. 22, the arc-shaped belts are in accord with the curvature of the mold, the crown components directly contact the mold, and the extensional ratios of the tire belt at different positions are the same. As seen from the simulation results shown in FIG. 22, the abnormal crown problem disappears.

Figure 23:
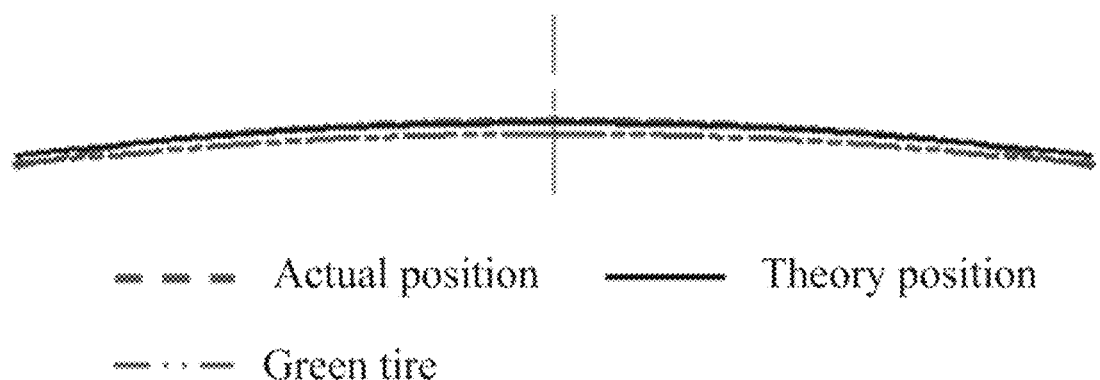
FIG. 23 is the position change of the belt3 using the curved surface drum.
Figure 24A:
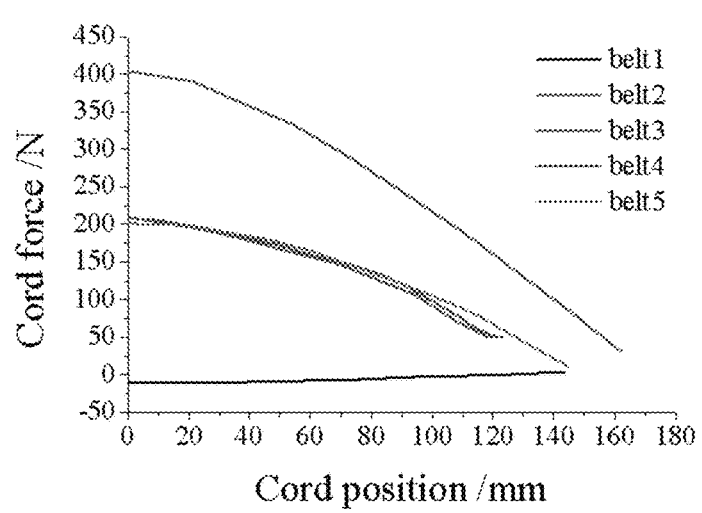
FIG. 24(a) is belts rebar force using curved surface drum.
Figure 24B:
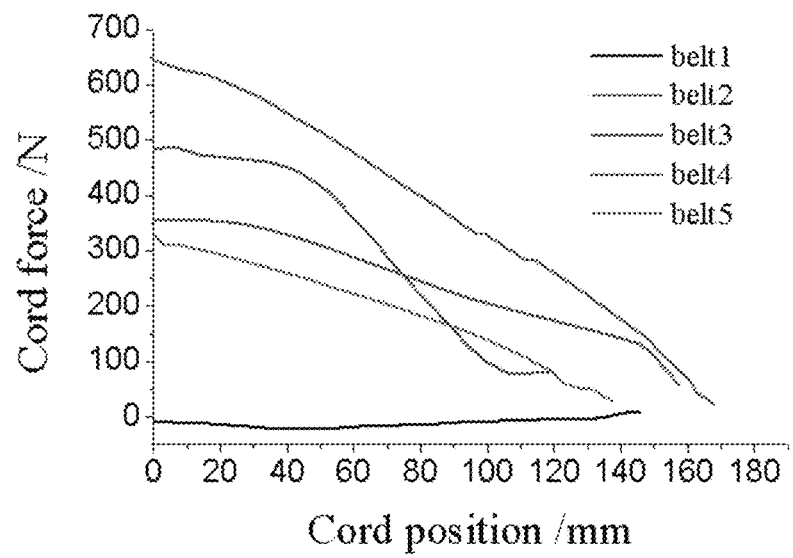
FIG. 24(b) is belts rebar force using plane drum.

The location change of the belt3 is shown in FIG. 23. It can be seen from FIG. 23 that the extensional ratios in different positions are the same, and the position of the belt3 in the vulcanizer is in accordance with the theoretical material distribution. The comparison of rebar force of the belt1, belt2, belt3, belt4, belt5 using the curved surface drum and the plane drum is shown in FIG. 24, which shows that the rebar force of the five belts using the curved surface drum in the middle of the crown decreases significantly, and the rebar force gradient reduces in the meridian direction.

S6: To Validate the Accuracy of the Curved Surface Belt Drum

Figure 25:
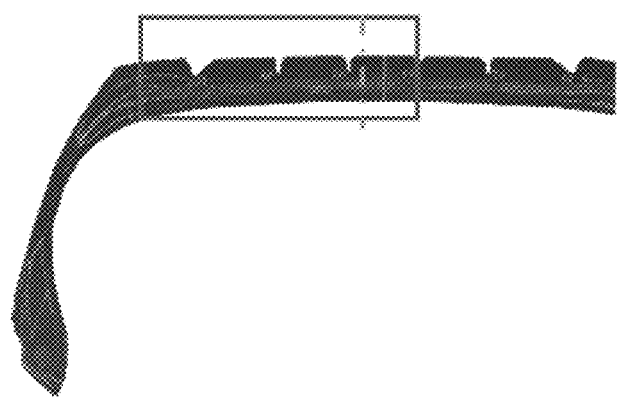
FIG. 25 is the cross-section of a sample tire when using the curved surface drum.

According to the design parameters in FIG. 20, the curved surface drum is made by sticking arc-shaped rubber on the surface of the plane drum. The sample tire section made by the curved surface drum is shown in FIG. 25. From the comparison results of FIG. 16 and FIG. 25, the sample tire has a good section and the abnormal inner unevenness problem does not appear. In addition, the material distribution of the sample tire is consistent with the theoretical material distribution.

Reversal Design Method of Tire Semi-Finished Components

Inspired the tire building process simulation in the S3, the tire semi-finished components design method including test rubber mechanical property, choose constitutive model, and establish finite element model, semi-finished components reversal design and building simulation verification.

S7: Tire Rubber Mechanical Test and Constitutive Model Choice

The shear relaxation modulus and stress-strain curve of each rubber are obtained by shear test and the uniaxial tensile test. The reference standards of the shear test and uniaxial tensile test are ISO 289-1:2005 and ISO 37:2005 respectively. The generalized Maxwell model and Marlow hyper-elastic model are used to characterize the viscous behavior and hyper-elastic property of the unvulcanized rubber. Because there are many type rubbers in tire components, taking the tread rubber and the inner rubber as the examples, it is used to examine the validity of rubber mechanical test and constitutive model. The selected method of the rubber constitutive model is consistent with S1.

S8: Establishment of Finite Element Model for Tire Components

According to the building requirements, the finite element model of all the tire components is established. The wide-base radial truck tire is simplified as an axisymmetric model. The rubber components are discredited with CGAX3H and CGAX4H element, which present incompressible rubber behavior; Reinforcement materials in the carcass, the belts and enhancement plied are modeled with SFMGAX1 elements that carry rebar layers, which is embedded in continuum rubber components elements. The bead is defined as isotropic material described by C3D8R element.

Figure 26:
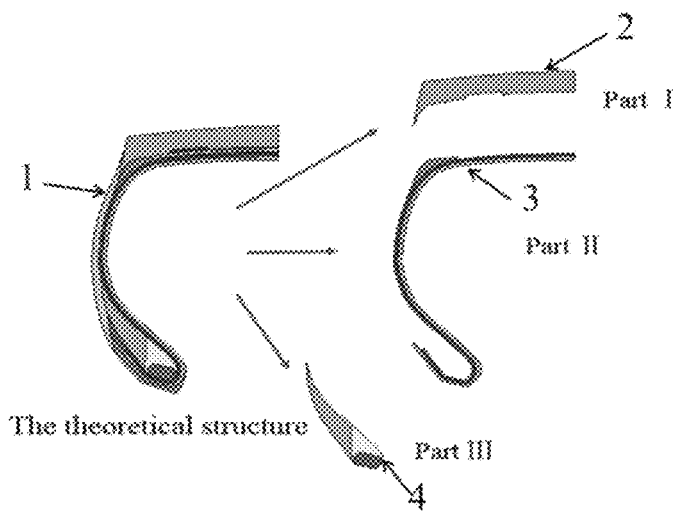
FIG. 26 shows the schematic distribution of the theoretical material distribution.

The tire theoretical marital distribution is divided into three parts for rubber components reversal design, as shown in FIG. 26, which are named as tread subsystem Part I, carcass subsystem Part II, and triangular subsystem Part III. The tread subsystem Part I only comprises a tread (6); the carcass subsystem Part II comprises a carcass, a strength, an inner and a shoulder, the triangular subsystem Part III comprising a bead (8), a soft apex (13) and a hard apex (14). The three Parts are meshed with element size is 3-6 mm. All the finite element model of tire components are meshed by HYPERMESH software.

(2) Contact simulation: during tire building process, the adhesion between the various components is very strong, so the direct constraint method of coulomb friction is used to simulate the contact behavior between different tire components.

Figure 27:
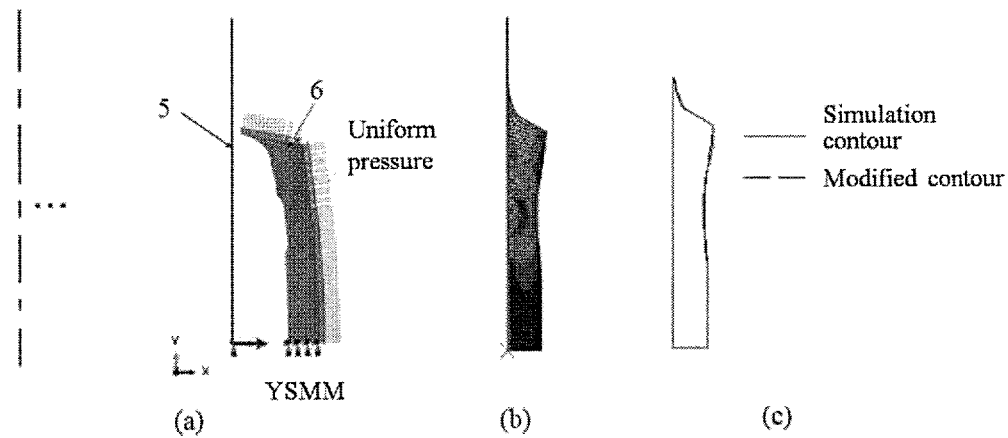
FIG. 27 shows the shape determination of the tread subsystem.

S9: Reversal Design for Tire Semi-Finished Components (1) Reversal Design of Tread Subsystem Part I The shape and position of the tread (6) obtained from the tire theoretical material distribution, which is shown in FIG. 27 (a). The tread (6) is formed into plane as a rigid body (5) by means of the simulation method, the shape of the tread (6) is reduced to the shape of the semi-finished part of the green tire (1).

The specific process in the simulation is: a plane rigid body (5) is provided on the inside of the tread (6), and the rigid body (5) is moved to outside of the tread (6), at the same time, a uniform pressure P is applied to the tread (6) outside. The rigid body move and the uniform pressure work together to obtain the shape of the tread (6) by the reverse simulation. The shape of the tread (6) is shown in FIG. 27(b). Synthesizes considering the shape of tread in FIG. 27(b) and extruding die size of the tread (6), and the reverse shape of the tread (6) of the semi-finished part is shown in FIG. 27 (c). It should be pointed out that the present method ignores the pattern groove. It should be noted that the present method ignores the pattern groove. If the pattern groove is considered, according to the principle of rubber volume invariably, and the groove relative position and groove volume in the theoretical material distribution, the shape of the semi-finished part of the tread (6) is obtained by subtract the shape of the pattern groove.

(2) Reversal Design of Carcass Subsystem Part II

Figure 28:
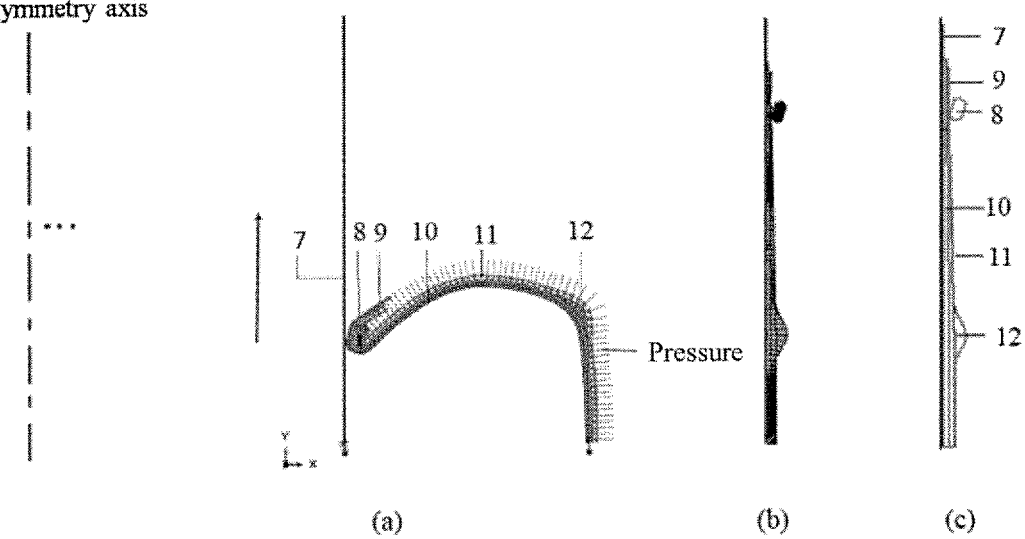
FIG. 28 shows the shape determination of the carcass subsystem.

The radial extension ratio of inner (10) and carcass (11) is not uniform at different position, where the maximum extension ratio occurs at the crown of tread (6), the minimum occurs at the bead (8). Although, the thickness of each of them at different position after inflation is inequality, the volume remains unchanged before and after expansion. The shoulder rubber (12) will appear radial extension and bending during tire building process, but its volume is invariant. In the reversal design simulation, the shape of the carcass (11), the inner (10) and the shoulder (12) are determined according to the shape and position of the theoretical material design. A uniform pressure is applied to the outside of the carcass (11) as shown in FIG. 28(*a*), and the bead (8) moves to two sides, thus the carcass (11) and the inner (10) are spread on the carcass drum (7), and the reversal simulation result is shown in FIG. 28(*b*). According to the extrusion die of each component, the shape of the modified tire semi-finished components of Part II is shown in FIG. 28(*c*).

(3) Reversal Design of Triangular Subsystem Part III

Figure 29:
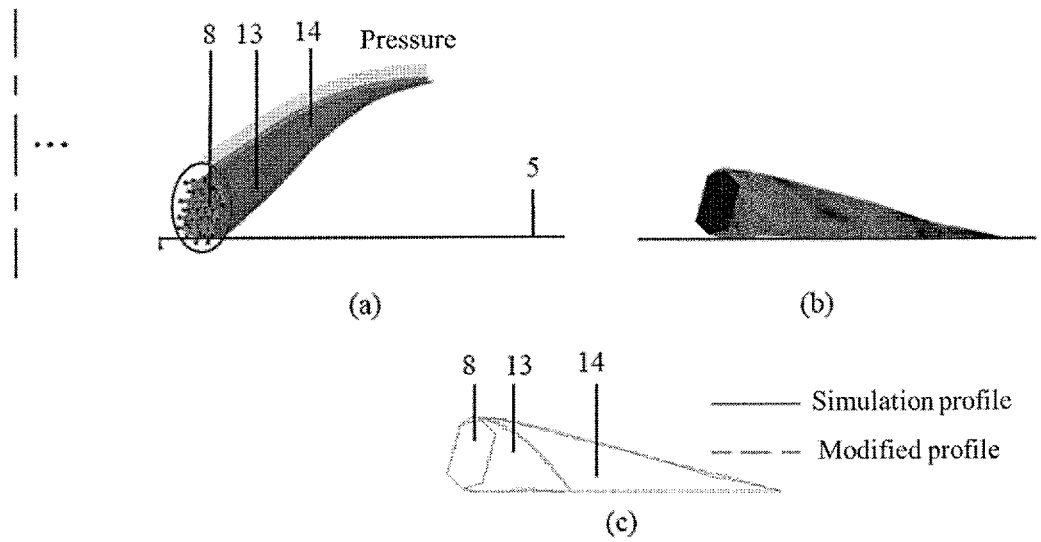
FIG. 29 shows the shape determination of the triangular subsystem.

During tire building process, the hard apex and the soft apex are rotated around the bead (8) (as shown in FIG. 29 (*a*)), and the radial expansion ratio is small. In the reversal building simulation, the shape of the triangular subsystem components is determined according to the shape and position in the theoretical material design. The bead (8) is fixed and a uniform pressure is applied to the outside of the hard-apex (as shown in FIG. 29 (*b*)). According to the extrusion die of the triangular rubber, the shape of the modified semi-finished parts of Part III is shown in FIG. 29 (*c*).

(4) Determination of the Shape of Other Tire Components

During the sidewall anti-package process, the capsule squeezes the sidewall and the abrasion, but these deformations are very small. Besides, the shape, width and thickness of the belt ply remains unchanged, so the shape of belt ply can be directly determined from the tire theoretical material design.

(5) Tire Building Simulation Verification

Figure 30:
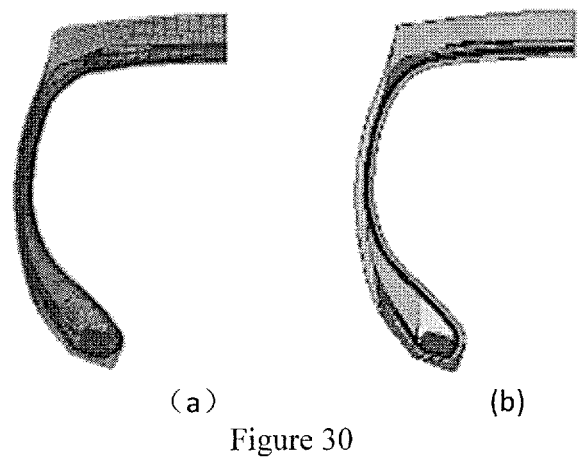
FIG. 30 shows the tire components comparison between the simulation section and the theoretical section.

The semi-finished components obtained from step S9 are subjected to the forward building simulation of step S3, and the simulation results of the shape and distribution of each component are shown in FIG. 30(*a*). FIG. 30(*b*) shows the shape and distribution in the theoretical material design. The comparison result from FIG. 30 shows that the consistency of the two is very good. In other words, the reversal design method for tire semi-finished components has a great influence on improving tire product uniformity.

The example presented above are preferred practice of the present invention, however, the invention is not limited to the practice described above. Any modifications, substitutions of the invention are subject to the invention protection.

The invention claimed is:

1. A method of improving a production process for a wide-base radial truck tire, the method comprising the following three steps:

(A) determining whether a shape of a carcass ply of the wide-base radial truck tire is in a bent state or not based on a positive and a negative of a carcass rebar force value of the carcass ply during a building process of the wide-base radial truck tire by using a numerical simulation of the building process of the wide-base radial truck tire, and adjusting tire production process parameters of the wide-base radial truck tire until the carcass rebar force value is positive such that it is determined that there is no bending in the carcass ply;

(B) determining structural parameters of a belt drum of a tire molding machine based on anomalous phenomena of a crown rubber flow in the production process of the wide-base radial truck tire through the numerical simulation of the building process of the wide-base radial truck tire; and (C) in accordance with a shape of a semi-finished components during the production process of the wide-base radial truck tire, determining design structure parameters of the semi-finished components of the wide-base radial truck tire using the numerical simulation of the building process of the wide-base radial truck tire, wherein the numerical simulation of the building process of the wide-base radial truck tire comprises the following steps:

(A1) obtaining test data of rubber material, comprising obtaining a shear relaxation modulus and a stress-strain curve of each rubber material of the wide-base radial truck tire by conducting a shear test and a uniaxial tensile test at least once on each rubber material, and characterizing a viscous behavior and a hyper-elastic property of the each rubber material in an unvulcanized state by using a generalized Maxwell model and a Marlow hyper-elastic model;

(A2) establishing finite element models for each component of the wide-base radial truck tire, the wide-base radial truck tire comprising carcass drum components, belt drum components, and triangular rubber components, the carcass drum components comprising a sidewall rubber, an abrasion rubber, aplastic, an inner layer, a strength layer, a carcass layer, and a shoulder rubber, the belt drum components comprising a belt1, a belt2, a belt3, a belt0, and a tread rubber, and the triangular rubber components comprising a bead, a hard-triangular rubber, a soft triangular rubber, and a rubber plastic, the establishing of the finite element models comprising:

(A2a) simplifying the wide-base radial truck tire as an axisymmetric model, simulating the carcass drum components as a first analytical rigid body, simulating the belt drum components as a second analytical rigid body, and meshing all the finite element models of the components by using numerical simulation software, and selecting a half of the axisymmetric model for the building process of the wide-base radial truck tire in order to reduce computing time, the meshing comprising using a mesh size;

(A2b) controlling the mesh size within a range of 3 mm to 5 mm in the carcass drum components, controlling the mesh size within a range of 3 mm to 7 mm in the belt drum components, and controlling the mesh size within a range of 4 mm to 8 mm in the triangular rubber components;

(A2c) using the second analytical rigid body to simulate mechanical characteristics of a structure of the belt drum components according to the structural parameters of the belt drum of the tire molding machine; and (A2d) using a direct constraint method of coulomb friction to simulate contact behavior between the different tire components;

(A3) simulating the building process of the wide-base radial truck tire, comprising (A3a) according to a building process of the tire molding machine, simulating gluing of the sidewall rubber, the abrasion rubber, the inner layer, a lower inner liner, the strength layer, the carcass layer, and the shoulder rubber sequentially to form a carcass drum and then placing and gluing of the belt1, the belt2, the belt3, the belt0, and the tread rubber to form the belt drum:

(A3b) respectively importing into the numerical simulation software the carcass drum and the belt drum from (A3a) along with the triangular rubber components, followed by simulating of successively assembling the carcass drum and the belt drum and positioning the triangular rubber components on the belt drum according to positioning parameters, followed by simulating of applying a first uniform distribution pressure within a range of 0.1 MPa to 0.2 MPa on the inner layer of the wide-base radial truck tire to simulate an inflation process while simultaneously simulating displacement of tire beads to stereotype locations, followed by simulating a turn-up process of a sidewall of the wide-base radial truck tire by simulating of applying a second distribution turn-up bladder pressure within a range of-0.2 MPa to 0.4 MPa on a surface from the abrasion rubber to the sidewall rubber until the turn-up process is completed, thereby forming a green tire;

(A3c) putting the green tire obtained in (A3b) into a vulcanizing tank, and making the green tire fit with a vulcanizing mold, followed by simulation of applying a third uniform distribution pressure on the inner layer of the wide-base radial truck tire to simulate a curing process and perform presetting, wherein the third uniform distribution pressure is 0.9 MPa, followed by simulation of applying a fourth pressure of 2.6 MPa to the inner layer of the green tire so as to form a finished tire.

2. The method according to claim 1, wherein the step of determining whether the shape of the carcass ply is in a bent state or not comprises:

after the finished tire is formed in sub-step (A3c), the carcass rebar force value at a crown of the finished tire after shaping in the vulcanizing tank is exported so as to obtain distribution characteristics of a carcass rebar force of the wide-base radial truck tire , and if the carcass rebar force value is positive, it is determined that there is no bending in the carcass ply and if the carcass rebar force value is negative, it is determined that there is bending in the carcass ply.

3. The method according to claim 1, wherein the step of determining the structural parameters of the belt drum comprises the following:

(B1) performing a preliminary determination of the structural parameters of the belt drum, comprising designing a middle section of the belt drum as a convex curved surface structure, wherein a cross-sectional profile of the belt drum comprises two straight lines and a curved line positioned between the two straight lines, a radius of curvature of the curved line is defined as R, a width of the curved line is defined as d, a diameter of the belt drum is D, and lengths of the two straight segments are defined as $l_1$ and $l_2$, respectively, wherein $$D = \frac{D_1}{1+\psi}$$

$$l_1 = l_2 = \frac{L-d}{2}$$

where L is a total width of the belt drum, $D_1$ is a radius of curvature of the belt3 measured in a tire theoretical material distribution δ is an elongation ratio of the belt3 and is in a range of 0.2%-1.0%; and (B2) according to the simulation of the green tire formation in sub-step (A3b), a distance between a belt in the green tire and a belt in a theoretical tire is Δr in a warp direction, then an expected value of the elongation ratio of the belt3 is $$\delta = \frac{\Delta r}{R_1} = \frac{R_0 - R_1}{R_1} \times 100\%,$$

where $R_1$ and $R_0$ are radials of the belt3 in the green tire and in the theoretical tire, respectively, values of d, R, and D are adjustable so that δ is in the range of 0.2%-1.0%, and wherein the values of d and R are repeatedly adjusted until any abnormal crown problem disappears.

4. The method according to claim 3, wherein the structural parameters of the belt drum are initially determined in the sub-step (B2), wherein the value of d is 80%-120% of width of the belt3 in the theoretical tire, and the value of R is 70%-130% of a radius of curvature of the belt3.

5. The method according to claim 1, wherein the step of determining the design structure parameters of the semi-finished components comprising the following:

(C1) performing a reversal design of the semi-finished components, comprising dividing a tire theoretical material distribution into three parts for rubber components of the reversal design, by applying an opposite boundary to the building process of the wide-base radial truck tire to determine shape and design parameters of the three parts, wherein the boundary conditions comprise a roll pressure, an inflation pressure in the building process of the wide-base radial truck tire, and a friction coefficient among the rubber components and the belt drum, and wherein the three parts comprise a tread subsystem Part I, a carcass subsystem Part II, and a triangular subsystem Part III; and (C2) performing a tire building simulation verification comprising using the shape and design parameters of the three parts for the numerical simulation of the building process and analyzing and contrasting a shape and material distribution of the three parts , and using the numerical simulation of the building process to verify that the reversal design of the semi-finished components is practical.

6. The method according to claim 5, wherein the tread subsystem Part I, the carcass subsystem Part II, and the triangular subsystem Part III comprise a plurality of rubber models and a rebar-rubber composite material, and wherein models of the tread subsystem Part I, the carcass subsystem Part II, and the triangular subsystem Part III are axisymmetric models.

* * * * *